US 6,671,652 B2

(12) United States Patent
Watson, Jr. et al.

(10) Patent No.: US 6,671,652 B2
(45) Date of Patent: Dec. 30, 2003

(54) CLOCK SKEW MEASUREMENT CIRCUIT ON A MICROPROCESSOR DIE

(75) Inventors: Richard B. Watson, Jr., Harvard, MA (US); Sean Michael Welch, Ithaca, NY (US); Oscar Mendoza, Worcester, MA (US); David F. Bertucci, Hudson, MA (US)

(73) Assignee: Hewlett-Packard Devlopment Company, L.P., Houston, TX (US)

( * ) Notice: Subject to any disclaimer, the term of this patent is extended or adjusted under 35 U.S.C. 154(b) by 83 days.

(21) Appl. No.: 10/036,889

(22) Filed: Dec. 26, 2001

(65) Prior Publication Data

US 2003/0120456 A1 Jun. 26, 2003

(51) Int. Cl.[7] .................................................. G04F 1/00
(52) U.S. Cl. ..................................................... 702/177
(58) Field of Search ......................... 702/177; 327/158, 327/6, 151; 331/34; 375/377

(56) References Cited

U.S. PATENT DOCUMENTS 5,818,265 A * 10/1998 Meller et al. .................. 327/6
6,127,871 A    10/2000 Moll .......................... 327/270
6,163,586 A *  12/2000 Hongbin Hao et al. ...... 375/377
6,184,753 B1 *  2/2001 Ishimi et al. ................. 331/34
6,222,400 B1 *  4/2001 Fukuda et al. .............. 327/151
6,229,363 B1 *  5/2001 Eto et al. .................... 327/158
6,346,837 B1 *  2/2002 Shibayama .................. 327/156

FOREIGN PATENT DOCUMENTS

JP           2000-286697       * 10/2000

* cited by examiner

Primary Examiner—John Barlow
Assistant Examiner—Tung Lav

(57) ABSTRACT

A structure and related method for determining the uncertainty window associated with clock signals on a microprocessor using circuitry on the microprocessor die itself and external software. A target clock signal of interest is compared to a series of reference clock signals having the same frequency, but differing in phase relationship. Where the target clock signal makes state transitions with respect to the various reference clock signals over the course of several thousand comparisons is indicative of the uncertainty window for that target clock. By adjusting the phase relationship between the reference clock signals, and thereby adjusting the width of the time windows defined by corresponding features of the reference clock signals, the uncertainty window for the target clock signal may be iteratively determined.

38 Claims, 6 Drawing Sheets

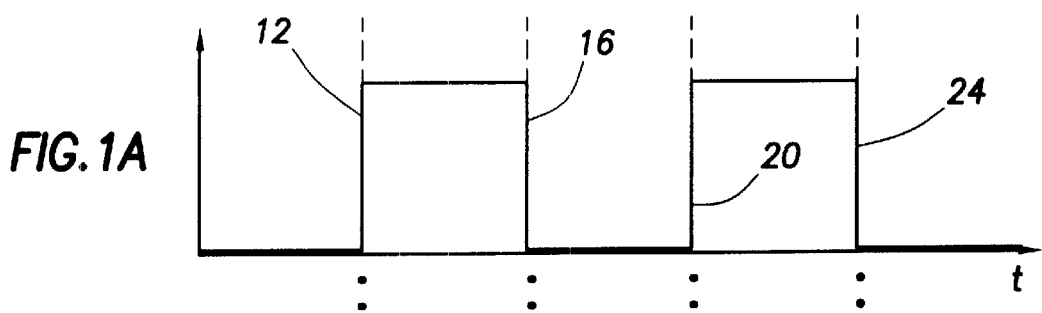
FIG.1A
FIG.1B
FIG.1C
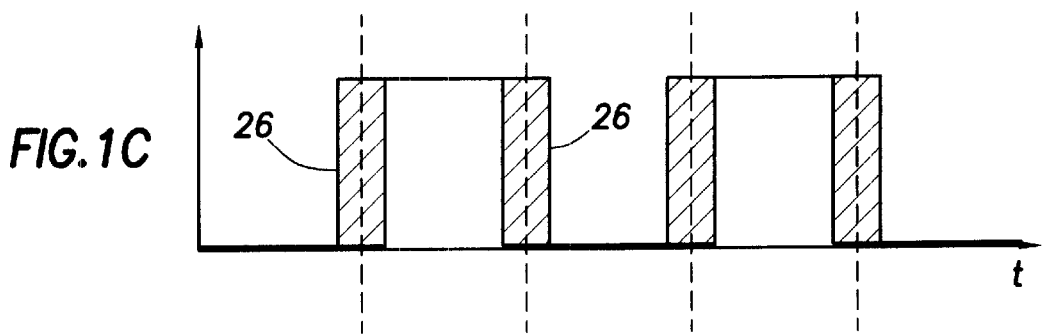
FIG.5A   00000 00000 00000 00000 00000 00000 00000
FIG.5B   11111 11111 11111 11111 11111 00000 00000

CLOCK SKEW MEASUREMENT CIRCUIT ON A MICROPROCESSOR DIE

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

1. Field of the Invention

The present invention relates generally to microprocessors for computer systems. More particularly, the present invention relates to measuring skew and jitter of various clocks of a microprocessor. More particularly still, the present invention relates to measuring the uncertainty window of a target clock signal caused by skew and jitter, the measurement made with circuits on the microprocessor die.

2. Background of the Invention

The trend in modem microprocessor design is to place increasing functionality onto the microprocessor die. Early microprocessors, for example, did not have onboard floating point units or onboard cache. In more recent times, it is rare to find a microprocessor manufacturer who does not incorporate a floating point unit and at least some cache on the microprocessor die. To some extent the incorporation of additional circuits on the microprocessor die has been made possible by advances in manufacturing technologies that allow semiconductor companies to shrink the size of the various electrical components created on the silicon substrates. Notwithstanding that manufacturers may now place more components in the same area than they could just a few years ago, the overall footprint of microprocessors has increased significantly as well. This increase in size, along with the incorporation of additional components within the microprocessor, creates problems in the distribution of clock signals throughout the microprocessor.

Electrical signals move from point to point in electrical conductors at a speed approaching that of the speed of light. While this speed of propagation is very fast, it is finite, and at the component spacings and clocking speeds of modem microprocessors (on the order of 1 Giga-Hertz or more), these finite speeds can cause timing problems between various clock domains or patches of a microprocessor. One timing problem associated with clock propagation speed is usually seen in the form of delays in the arrival of clock pulses, which is known in the industry as skew.

In the design of microprocessors, clock domains receive their clock signal through a distribution tree. That is, the clock signals propagate through many circuits, which may include devices such as clock buffers and delay locked loops, in their distribution about the microprocessor die. In its most fundamental form, any logic gate that the clock signal propagates through is simply one or more transistors. There may, however, be variations in transistor speeds across a microprocessor die caused by irregularities in doping and etching (device widths) during manufacture. Further, large die microprocessors may have temperature variations across the chip during operation. For example, there may be a significant localized temperature increase in the floating point unit of a microprocessor when executing floating point intensive operations These temperature variances may affect operational speeds of the transistors in the region of localized temperature increase. The localized temperature increases are sporadic and highly dependent upon the software executed by the microprocessor. Because of the variations in logic gate propagation speeds and the localized temperature increases, accurate prediction or design of the arrival of any particular clock signal is difficult. All these factors contribute to cause skew and jitter in the clock circuits distributed about the microprocessor.

For purposes of further explanation of the terms skew and jitter, reference is now made to FIG. 1A. FIG. 1A shows several clock pulses of an ideal clock signal. The waveform represented in FIG. 1A is ideal in the sense that it shows practically instantaneous rise and fall times between the high voltage state and the low voltage state. Plotted on the same axis is FIG. 1B, which shows two aspects of the skew and jitter problem faced by clock designers. In particular, the first rising edge 10 of the waveform of FIG. 1B is shown to be some finite amount of time after the first rising edge 12 of the waveform of FIG. 1A. In similar fashion, the first falling edge 14 of the waveform of FIG. 1B is shown to be a finite amount of time after the falling edge 16 of the corresponding waveform FIG. 1A. Thus, this first rise and fall of the waveform of FIG. 1B is exemplary of clock skew. As the FIGS. 1A and 1B imply, clock skew is a shifting of a measured waveform relative to a reference waveform.

The waveforms of FIG. 1A and FIG. 1B also show the idea of duty cycle jitter. In particular, the second rising edge 18 of the waveform of FIG. 1B is shown to be a finite amount of time after the rising edge 20 of the waveform 1A. However, the falling edge 22 of the waveform of FIG. 1B is shown to be in exact time alignment with the falling edge 24 of the waveform of FIG. 1A. Thus, the duty cycle (the ratio of a signal's high voltage time to its low voltage time) has changed. Momentary changes in duty cycle may increase or decrease the duty cycle, as well as the rise and fall times of any particular clock pulse.

A microprocessor designer may not know precisely when a particular clock signal may arrive at a clock domain of the microprocessor relative to a master clock. Rather, and referring to FIG. 1C, the skew and jitter of a clock signal results in a fuzz or uncertainty window 26 within which a state transition (rising or falling edge) may occur. The uncertainty window represents the span of time within which a clock signal may make a state transition. Thus, what becomes important to a clock system designer is not when any one particular state transition occurs, but the width of uncertainty window 26 within which that rise or fall may occur.

Knowing the uncertainty window 26 is important to the microprocessor designer for many reasons. One reason may be the exchange of information between various clock domains of the microprocessor. In particular, in the exchange of information between clock domains of the microprocessor, it is important that data is asserted for a requisite amount of time such that the receiving device has the ability to read that information. Holding the information in its proper state is sometimes referred to as hold time. If the uncertainty window 26 becomes too wide, the resulting active time of any particular clock signal may become too short to allow the receiving clock domain to read and store the information. Thus, microprocessor designers need to know the width of the uncertainty window 26. The prior art, however, has been deficient in providing a system to make this measurement.

Two prior art techniques exist for measuring particular signals on a microprocessor die, including clock signals.

Both methods involve machining through the bottom of the microprocessor silicon substrate to measure particular signals by observing their affect on hardware of the microprocessor. The first technique involves shining and infra-red (IR) lazer at the channel-drain region of metal oxide semiconductor (MOS) transistors in the signal chain of interest. This technique relies on the fact that the IR reflectivity caused by field and carrier effects in the PN junction between the drain and inversion layer change as the particular transistor switches on and off. Data gathering in this first technique must take place over several minutes. The second prior art approach gathers photons emitted from switching transistors. However, a transistor does not release a photon every time it operates, thus requiring the measurement procedure to extend over several hours.

Each of the two prior art techniques requires expensive equipment, elaborate die preparation, and highly trained people to run and maintain the equipment. Because of the time and expense associated with these two prior art techniques, they are generally only applicable as a design debug technique, and not as a manufacturing test technique.

Thus, what is needed in the art is a mechanism by which a clock designer can measure the uncertainty window of a clock signal on a microprocessor die without the need of expensive equipment or destructive test procedures.

BRIEF SUMMARY OF THE INVENTION

The problems noted above are solved in large part by a structure and related method which measures the uncertainty window of clock signals on the microprocessor die using circuitry on the microprocessor die itself. In this way, no expensive equipment or destructive test procedures are required. More particularly, in the preferred embodiment, each cache region of the microprocessor has a jitter measurement circuit. This jitter measurement circuit is adapted to measure the uncertainty window of the clocks of those caches. An alternative embodiment may also measure the uncertainty window associated with other clock signals on the microprocessor by use of a multiplexer. The jitter measurement comprises a calibration unit, a delay unit and a measurement unit. Preferably, the calibration unit is used to establish an on-die time reference, and that time reference is used to calibrate various other portions of the jitter measurement circuit. The delay unit has a plurality of adjustable delay circuits. By coupling each of these adjustable delay circuits to a host clock, and setting the delay associated with each adjustable delay circuit different from the others, a plurality of reference clock signals having the same frequency but differing in phase relationship are created. In the preferred embodiment, four such reference clock signals are created. By defining time windows or bins between corresponding features of these reference clock signals, three time windows or bins are created. Because the delay circuit within each delay unit is adjustable, the time width of these windows or bins may be adjusted as necessary, and as part of the procedure for determining the uncertainty window. Preferably these four reference clock signals, and the clock signal to be measured, the target clock, are coupled to the measurement unit.

In the measurement unit, the reference clock signals and the target clock signals are compared. More particularly, the target clock signal is compared to each of the reference clock signals to determine whether that target clock signal makes a state transition before or after the particular reference clock signal. In this way, a determination is made regarding within which time window or bin the target clock signal makes its state transition. By running this comparison over several thousand clock cycles of the target clock signal, a pattern develops as to the outer boundaries of state transitions of the target clock.

The preferred embodiment also comprises software which is preferably executed by hardware other than the particular microprocessor whose clock signal uncertainty windows are being measured. By way of the scan chain communication, the external software may adjust the relative sizes of the various time bins, start and stop measurement runs, and read results from those measurement runs. It is envisioned that calculating an uncertainty window for any particular clock in the microprocessor will be an iterative process involving repeatedly measuring the target clock signal against the reference clock signals with a particular time window width, adjusting those widths based on the outcome of a particular measurement run, and repeating the steps as necessary until the width of the uncertainty window is determined.

In another related aspect, the various circuits on the microprocessor die need to be calibrated prior to any measurement run to determine the uncertainty window. The calibration unit, previously mentioned, preferably aids in the calibration by establishing a time reference on the microprocessor die. More particularly, in the preferred embodiment, the calibration unit determines the propagation speed of inverters on the microprocessor in relation to the period of the clock applied to the microprocessor. While the on-die circuitry may not know the frequency of the applied clock, preferably the external software does. By knowing how many inverter propagation delays fit within one complete period of the applied clock, the external software may therefore calculate the propagation delay time of any particular inverter. Relying on the fact that the propagation delay time of inverters on the microprocessor die is known, the calibration unit also creates a plurality of calibration time references having the same frequency, but shifted in phase by an amount of time equal to the propagation of two inverters. These two calibration signals are used to calibrate other adjustable or programmable portions of the on-die circuitry for measuring the uncertainty window. In particular, each adjustable delay circuit of each delay unit uses these calibration reference signals to determine the time-wise effect of each tap of the adjustable circuit. More particularly still, by phase-locking first to the first reference signal, and noting the number of taps to facilitate this phase lock, then phase-locking to the second calibration reference signal, and again noting the number of taps required to complete this lock, the external software, now knowing the time difference between the calibration reference signals, and the difference in the number of taps to have the adjustable delay circuits locked to each of these signals, may attribute the time difference between the calibration reference signals to the difference in the number of taps between locking to those two signals. In this way, the time value of each tap is determined, and this information is then preferably used during the measurement procedure in setting the width of the various time bins.

BRIEF DESCRIPTION OF THE DRAWINGS

For a detailed description of the preferred embodiments of the invention, reference will now be made to the accompanying drawings in which:

FIG. 1A shows two complete cycles of an ideal clock signal;

FIG. 1B shows a clock signal exemplifying both skew and duty cycle jitter;

FIG. 1C shows a clock signal exemplifying the uncertainty window within which any particular clock may make a state transition;

FIG. 5A shows the preferred initial condition of the latches in the calibration unit;

FIG. 5B shows an exemplary thermometer code held by the latches of the calibration unit after allowing a signal to propagate for a known period of time;

NOTATION AND NOMENCLATURE

In the following discussion and in the claims, the terms "including" and "comprising" are used in an open-ended fashion, and thus should be interpreted to mean "including, but not limited to . . . ". Also, the term "couple" or "couples" is intended to mean either an indirect or direct electrical connection. Thus, if a first device couples to a second device, that connection may be through a direct electrical connection, or through an indirect electrical connection via other devices and connections.

So as not to unduly complicate the remaining portions of the specification, the following non-limiting definitions are provided. Certain terms are used throughout the following description and claims to refer to particular system components. As one skilled in the art will appreciate, computer companies may refer to components or properties of signals by different names. This document does not intend to distinguish between components or properties of signals that differ in name but not function.

Clock domain: a defined area on a microprocessor die operating at the behest of the same clock signal, e.g., the core. Each clock domain region may be operating at a same or different frequency than other clock domains on the same microprocessor. Clock domain may alternatively be referred to as a clock patch.

Jitter: a phenomenon where a periodic signal's state transitions are random and fluctuating in time as compared to a reference signal of the same frequency.

Scan chain: a series of registers throughout the microprocessor coupled together in such a way as to allow the information in each register to be shifted from register to register in the chain until all the information has been shifted, in a synchronous fashion, either into or out of the microprocessor.

Skew: time shifting, usually in the form of a time delay, of a signal caused by either or both of a distance traversed at a finite speed, or by propagation delay of the signal through various logic gates.

Thermometer code: a digital encoding scheme where the data of interest is encoded by the location of a one to zero transition in the code word. A thermometer code is so named because reading the code is similar to reading a mercury-type thermometer.

DETAILED DESCRIPTION OF THE PREFERRED EMBODIMENTS

Figure 2:
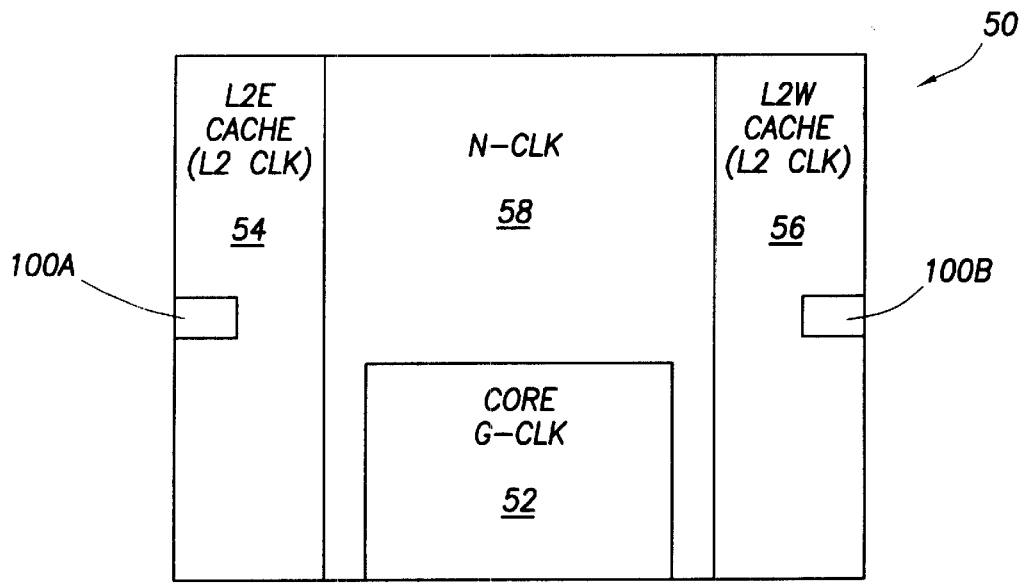
FIG. 2 shows an exemplary layout of a microprocessor.

FIG. 2 shows an exemplary layout of a microprocessor 50 of the preferred embodiment. In particular, FIG. 2 shows a core region 52 which is the heart of the microprocessor 50, and it is in this region where the microprocessor performs the bulk of its program execution. The core region 52 defines a first clock domain of the microprocessor 50. By convention, the clock that operates the core region 52 is known as the G-clock (G-CLK). This G-CLK is responsible for clocking all the synchronous functions within the core region 52. Referring still to FIG. 2, just outside the core region 52 is a second clock domain known as the N-clock (N-CLK) region 58. This region may contain many operable subsystems of the microprocessor 50, including a floating point unit (not specifically shown) and input/output (I/O) unit (not specifically shown).

Most modern microprocessors include cache memory on the microprocessor die. The preferred embodiment has two sets of onboard cache memory: L2E 54 and L2W 56. The "L2" portion of the identifier indicates that this region of the microprocessor is level 2 cache. The "E" or "W" portion of the identifier indicates whether the particular cache identified is east or west. As indicated in FIG. 2, the L2E 54 cache resides on the left side of the drawing and the L2W 56 cache resides on the right side of the drawing. Using conventional east and west directions, these designations appear to be in error, but by convention the L2E is typically shown on the left side of the drawing because this would be its location when viewing the microprocessor from the bottom of the silicon substrate, or from the front as viewed through a microscope. Much like the core region 52 and the N-CLK domain 58, each of the L2E 54 and L2W 56 regions represent independent clock domains.

Using a combination of circuitry on the microprocessor die, and software controlling the onboard circuitry, the preferred embodiment measures the uncertainty window of clock signals of the microprocessor. More particularly, the preferred embodiment measures the uncertainty window caused by skew and jitter of the L2E and L2W clock signals. Alternative embodiments measure other clock signals by the use of multiplexers, e.g., measuring the uncertainty window of the N-CLK domain. Because the preferred embodiments use onboard circuits and software communicating by way of the scan chain, no additional complicated equipment or destructive preparatory work is required.

Discussion of the various embodiments is broken up into two main parts: first, a discussion of operation of the disclosed embodiments for determining the uncertainty window; and second, a discussion of the preferred calibration techniques for the onboard circuitry. The first section regarding operation of the disclosed embodiments assumes adequate calibration of the various onboard circuits.

I. Operation of the Disclosed Embodiments

The preferred embodiment of the present invention measures the uncertainty window associated with each of the clock signals in the L2E 54 and L2W 56 clock domains. More particularly, the microprocessor 50 of the preferred embodiment has onboard circuitry capable of measuring the uncertainty window 26 (FIG. 1C) associated with the L2E 54 and L2W 56 clocks. Still referring to FIG. 2, the preferred embodiment comprises jitter measurement circuits 100A, B in each of the L2E 54 and L2W 56 regions of the microprocessor 50, respectively. These circuits are preferably manufactured onto the substrate during the normal microprocessor manufacturing process. It is to be understood that other than measuring the uncertainty window associated with different clock domains, the jitter measurement circuits 100A, B are substantially the same.

Figure 3:
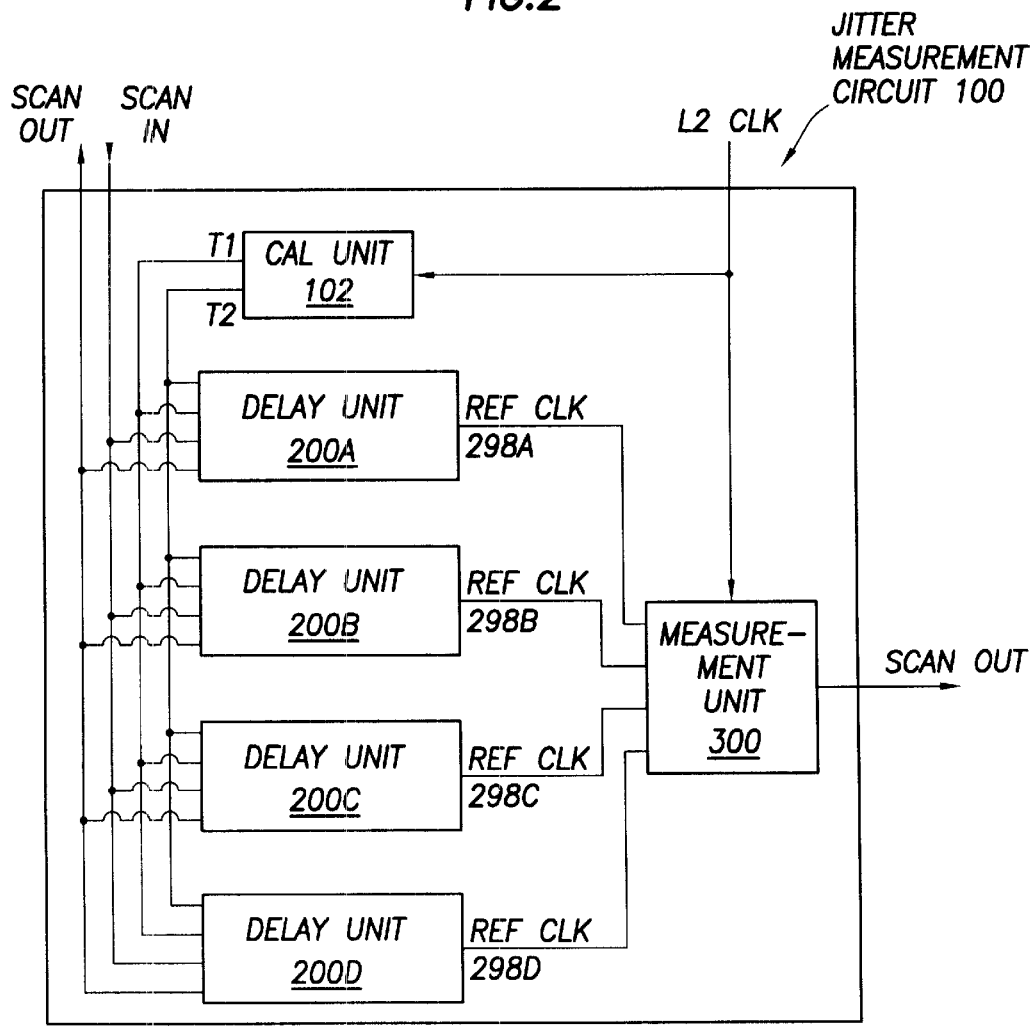
FIG. 3 shows an electrical block diagram of a jitter measurement circuit.

Referring now to FIG. 3, there is shown an electrical block diagram of a jitter measurement circuit 100 in accordance with the preferred embodiment. In broad terms, the jitter measurement circuit 100 is responsible for measuring the uncertainty window of the clock signals in the L2E 54 and L2W 56 portions of the microprocessor 50, the target clocks. The calibration unit 102 preferably establishes a time reference used to calibrate the remaining portions of the jitter measurement circuit 100, and is discussed more thoroughly in Section II below. Each of the delay units 200A–D are preferably used to create a plurality, in the preferred embodiment four, timing or reference clock signals to be used as time references in the measurement unit 300. The reference clock signals of the delay units 200A–D are preferably programmable such that they create a series of time windows or bins between corresponding features. The reference clock signals of the delay units preferably couple to the measurement unit 300, which preferably compares the target clock to the reference clock signals to determine when the target clock makes a state transition, e.g., low voltage to high voltage. The delay units 200A–D and measurement unit 300 are discussed in turn.

A. Delay Unit 200

Figure 6:
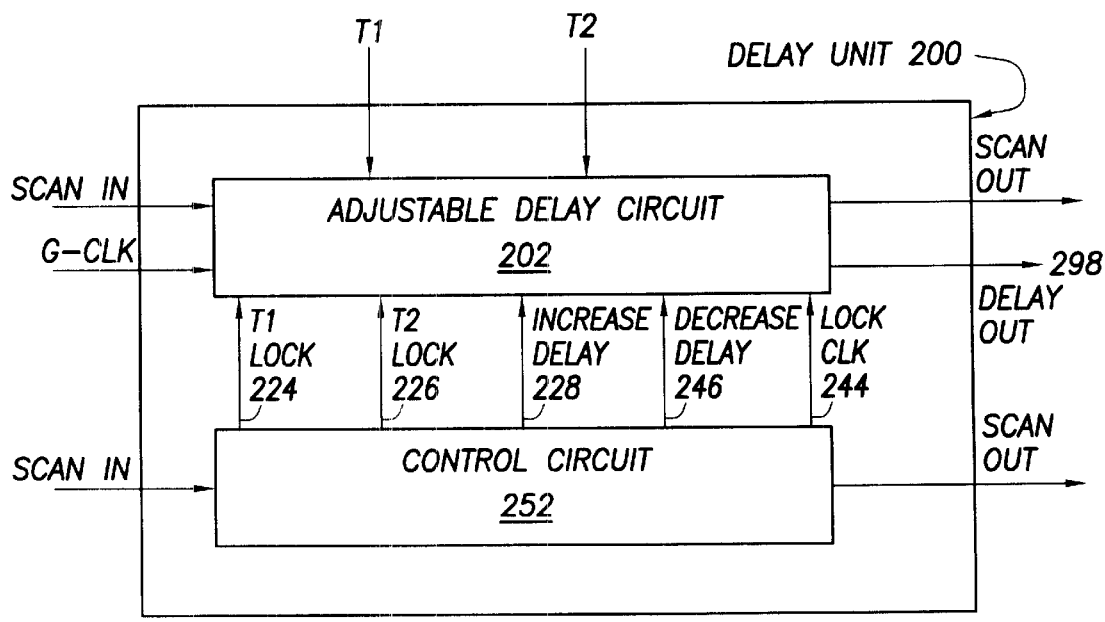
FIG. 6 shows an electrical block diagram of a delay unit.

Preferably, each of the delay units 200A–D provides the measurement unit 300 a digitally programmable reference clock signal for use in measuring the uncertainty window of a target clock. Referring now to FIG. 6, there is shown in more detail an electrical block diagram of a delay unit 200. In particular, each delay unit preferably comprises an adjustable delay circuit 202 and a control circuit 252. The control circuit 252 is responsible for controlling the adjustable delay circuit 202, and the adjustable delay circuit 202 is responsible for providing a digitally programmable delay.

Figure 7:
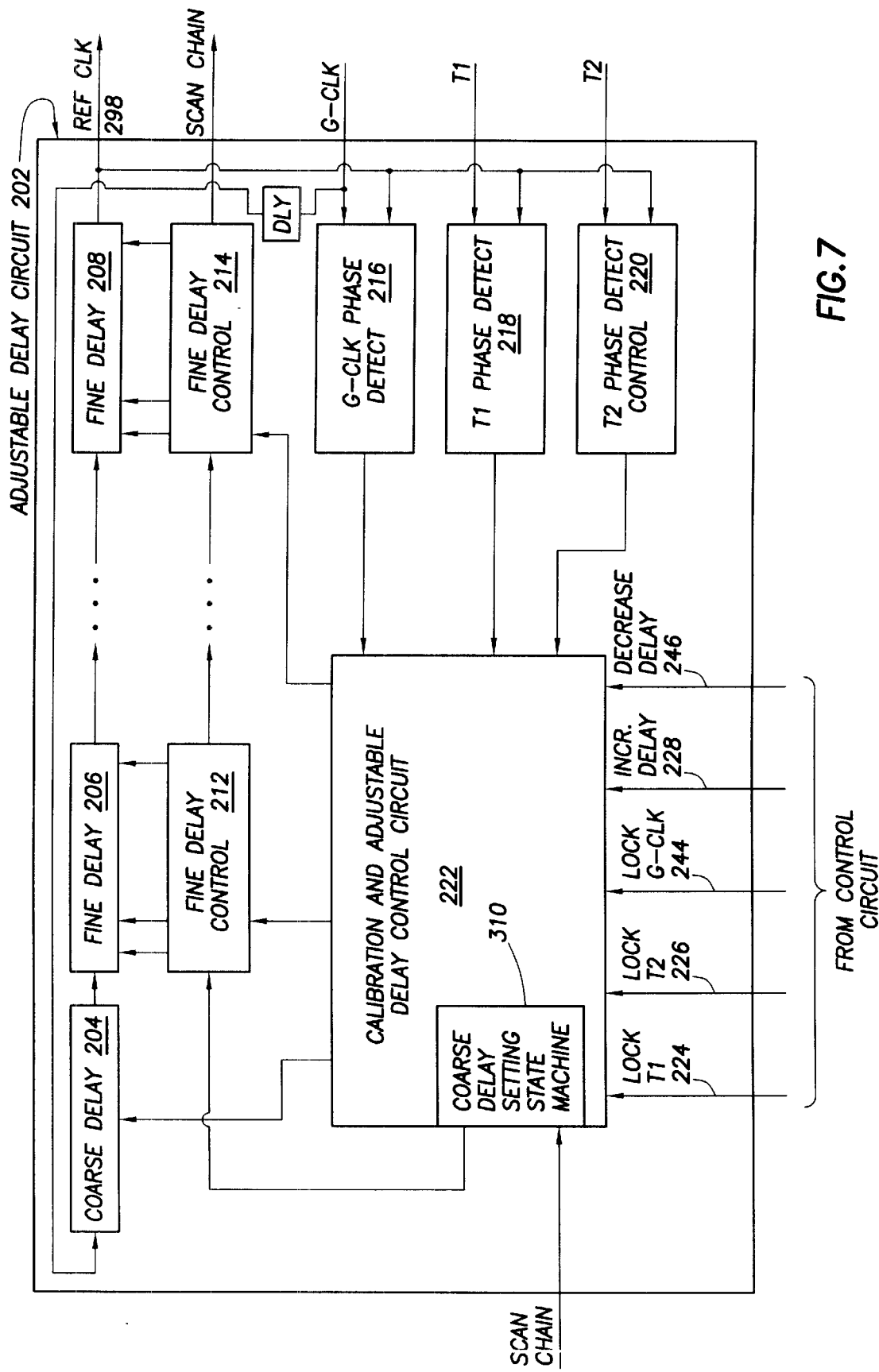
FIG. 7 shows an electrical block diagram of an adjustable delay circuit.

FIG. 7 shows a more detailed electrical block diagram of an adjustable delay circuit 202 which creates a reference clock signal 298. As shown in FIG. 7, the reference clock signal 298 is preferably created by coupling the G-CLK to a series of programmable delay elements. Thus, the frequency remains unchanged, but the delay results in a phase shift of the G-CLK signal. In particular, FIG. 7 shows a coarse delay circuit 204 and a plurality of fine delay circuits 206 and 208. The combination of all the fine delay circuits preferably provides a maximum of 500 picoseconds (ps) delay and a minimum of 200 ps delay. For clarity of the drawings, FIG. 7 only shows two such fine delay circuits 206 and 208; however, in the preferred embodiment, eight such delay circuits are provided. Associated with each delay circuit is a delay control circuit. In particular, each of the fine delay circuits 206 and 208 have associated therewith fine delay control circuits 212 and 214. Each of these control circuits 212 and 214 control delay of their associated delay circuit. Again, only two such delay control circuits are shown in FIG. 7 so as not to unduly complicate the drawing. However, inasmuch as in the preferred embodiment there are eight fine delay circuits, the preferred embodiment also comprises eight fine delay control circuits.

Figure 8:
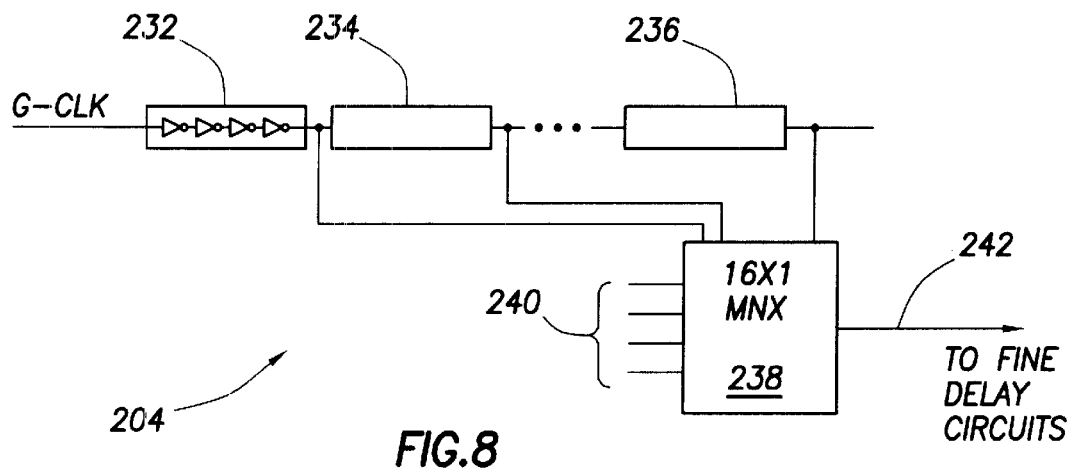
FIG. 8 shows an electrical block diagram of a coarse delay circuit.

Referring now to FIG. 8, the coarse delay circuit 204 is preferably a plurality, in the preferred embodiment 16, groups of inverter quadruplets 232, 234 and 236 connected in series. As indicated by inverter quadruplet 232, an inverter quadruplet is simply four inverting buffers connected in series. The output signal of each inverter quadruplet also connects to an input of a 16-by-1 multiplexer 238, whose output then becomes the output of the overall coarse delay circuit 204. Thus, by selectively asserting and de-asserting the control inputs 240 of the multiplexer 238, one of the sixteen inputs is coupled to the output 242. If a minimum amount of delay is required, the output from the first inverter quadruplet 232 is coupled to the output 242 of the multiplexer, thus providing minimum delay. Likewise, if maximum delay is required, the output of the sixteenth inverter quadruplet 236 is coupled to the output 242 of the multiplexer. How a particular delay is selected is the subject of the calibration mode of the overall unit, and is discussed more fully in Section II below. Preferably, the coarse delay circuit is capable of providing a maximum of 3100 ps of delay, and a minimum of 80 ps of delay.

Each of the line delay circuits 206, 208 is preferably an inverter. However, a logical Inverter gate is merely a combination of transistors configured in such a way as to perform the inversion operation. Like any logic circuit, it takes a finite amount of lime for a signal to propagate through the circuit. How fast a signal propagates through an Inverter is proportional to the size of the transistors that make up that inverter gate. Where multiple transistors are operated in parallel, the speed at which the signal propagates through the logic gate is proportional to the cumulative size of the transistors that make up the logic gate. The preferred embodiment utilizes this fact in creating the programmable fine delay circuits 206, 208. In particular, each fine delay circuit 206 and 208 is an inverter implemented in such a way as to have a plurality of parallel transistors that may be selectively added or removed from the inverter circuit. In this way, the overall speed of each inverter 206, 208 may be adjusted. Such adjustable delay inverter circuits are known in the art, Each of the fine delay control circuits 212, 214 are preferably responsible for digitally activating, when commanded, each set of parallel transistors as part of the overall delay setting.

Figure 9:
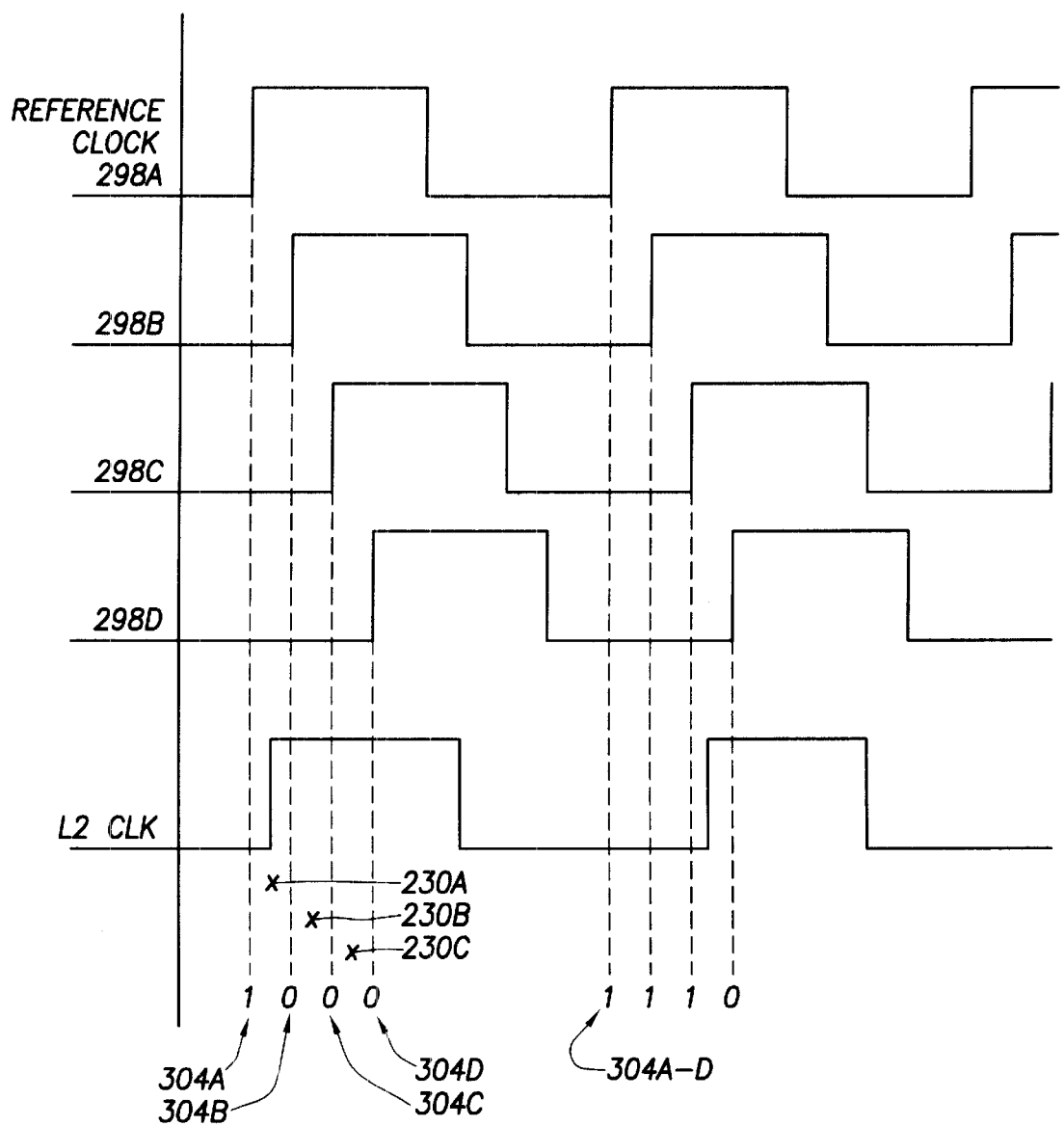
FIG. 9 shows an exemplary set of reference clock signals, an exemplary target clock signal, exemplary time bins created by the reference clock signals, and exemplary thermometer codes with the comparison of the exemplary reference clock signals to the exemplary target clock signal.

Referring now to FIG. 9, there are shown four exemplary reference clock signals 298A–D. As exemplified in FIG. 9, these reference clock signals 298A–D preferably have the same frequency, but are shifted in phase relationship. By shifting these signals in phase relationship, a plurality of time windows or bins are formed between corresponding features of the reference clock signals. In the exemplary drawing of FIG. 9, the corresponding features are the state transitions from a low voltage state to a high voltage state. In the preferred embodiment, four reference clock signals 298A–D are created, thus making three time windows or bins 230A–C. In FIG. 9, the time windows 230A–C are shown to be substantially the same width; however, the spacings may be adjusted in any appropriate way.

In operation, creation of the reference clock signals 298A–D, and thus creation of the time windows between corresponding features of the reference clock signals, is controlled by selectively delaying propagation of the G-CLK signal through each of the adjustable delay circuits 202. More particularly, and referring to FIG. 7, external software (discussed more fully below in Section C) preferably commands the calibration and adjustable delay control circuit 222 to selectively add or remove propagation delay to the delay chain. The calibration and adjustable delay control circuit adds and removes propagation delay through its respective adjustable delay circuit by commanding the fine delay control circuits 212, 214 to remove or add respectively parallel transmitters in each of the fine delay circuits 206, 208. Each reference clock signal 298A–D then couples to the measurement unit 300.

B. Measurement Unit 300

In broad terms, the measurement unit 300 is responsible for comparing the various reference clock signals 298A–D to the target clock (e.g., L2E, L2W or N-CLK). More particularly, the measurement unit 300 performs phase detection between each of the reference clock signals 298A–D and the target clock to determine whether, in each case, the target clock signal makes a state transition before or after each of the reference clock signals.

Figure 10:
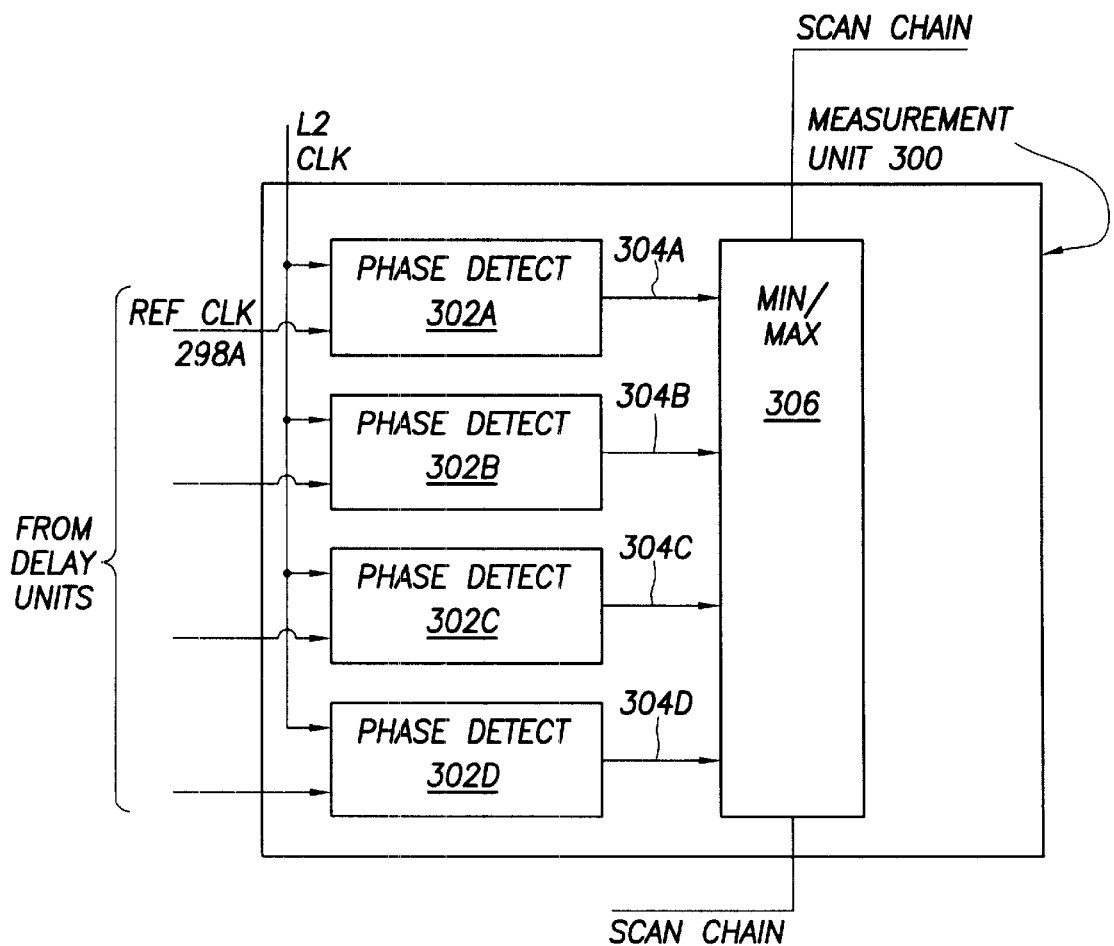
FIG. 10 shows an electrical block diagram of the measurement unit.

FIG. 10 shows a more detailed electrical block diagram of the measurement unit 300. The measurement unit 300 preferably contains four phase detection circuits 302A–D. Each of these phase detection circuits is preferably responsible for comparing its corresponding reference go clock signal 298 to the target clock (L2CLK in FIG. 10). Each of the phase detection units 302A–D preferably have a digital output signal which is indicative of the outcome of the phase detection process. In the preferred embodiment, the digital output signals 304A–D of each phase detection circuit 302A–D indicates a logic "1" when the target clock (L2CLK) makes a low voltage to high voltage state transition after the reference clock signal. Referring particularly to phase detection circuit 302A, if the measured clock (L2CLK) transitions from a low state to a high state after a corresponding state transition of the reference clock 298A, then the corresponding output 304A preferably becomes a logic "1". In counterpoint, if the target clock (L2CLK) makes a state transition from a low voltage to a high state prior to the reference clock 298A makes its corresponding state transition, then the digital output signal 304A preferably indicates a logic "0".

Referring again to FIG. 9, there is shown an exemplary target clock (L2CLK) signal with reference to the exemplary reference clock signals 298A–D. The exemplary target clock signal is shown to make a state transition from a low voltage state to a high voltage state within the first time bin 230A, and that same transition in the next clock period is in the third time bin 230C. Indicated directed below the dashed lines in each case are exemplary output signals of the phase detection circuits 302A–D for the timing signals shown. It is seen that the target clock signal, when phase detected against the plurality of outputs from the phase detection circuits 302A–D, creates a thermometer code which is indicative of which time window or bin the target clock made its state transition.

Each of the digital output signals 304A–D (FIG. 10) of the phase detectors 302A–D respectively, preferably couple to a minimum/maximum (min/max) unit 306. In broad terms, the min/max unit 306 is responsible for determining, over the course of several clock periods, e.g., 1,000, the minimum and maximum thermometer codes representing the total width of the uncertainty window of the target clock as may be discerned by the resolution of the time bins. Consider as an example, and without limitation, the timing diagram of FIG. 9. Shown are two arrivals of the target clock (L2CLK) falling into each of the left-most and the right-most bins 230A and 230C respectively. Below each exemplary arrival is an exemplary thermometer code indicated by the phase detection circuits 302A–D. If the thermometer code associated with the first target clock arrival (1000), and the thermometer code associated with the second arrival of the target clock of FIG. 9 (1110), occurred only one time each within an exemplary 1000 clock cycles, these thermometer codes represent the minimum and maximum thermometer code experienced and measured by the jitter measurement circuit 100. In this exemplary measurement system, the min/max unit 306 preferably stores these minimum and maximum values in registers residing on the scan chain. At appropriate times, the external software preferably shifts this information off the microprocessor to be used for determining the uncertainty window, or as part of the iterative process of determining the uncertainty window.

Determining the minimum and the maximum thermometer codes in the min/max unit 306 involves logically ORing and ANDing the outputs of the phase detection circuits 304A–D with themselves recursively. In particular, the minimum determination is preferably made by a latch and ANDing operation. The latch preferably is initialized to a logic "1" state, and has as its latch input the output of an AND gate ANDing the latched state with the phase detect output signal. Each respective phase detect output signal 304A–D is thus ANDed with its previous value. If the respective phase detection output signal 304A–D ever indicates a logic "0", that logic "0" is preferably latched into the latch circuit, and the ANDing operation thereafter always gives a logic "0". Likewise, in the maximum thermometer code determination, a latch circuit and a logic OR gate is used. For the maximum thermometer code determination, the latch circuit is preferably initiated into a logic "0" state, and has as its latch input the output of the OR operation of the present latched value and the phase detect output signal. If the respective phase detection output 304A–D ever indicates a logic "1" (indicating a time lag of the target clock to the reference clock), then the ORing function passes a logic "1" into the latch circuit. Thereafter, the OR function always indicates a logic "1". This minimum and maximum determination is made for each phase detection output signal 304A–D, and the values are stored during a measurement run.

Summarizing then, the min/max unit 306 makes a determination of the minimum and maximum thermometer code experienced for any particular setup of the reference clock signals, and therefore, any particular setup of the time bins 230A–C. Those values are then preferably communicated off-chip via the scan chain.

C. External Control Software.

The preferred embodiment of measuring the uncertainty window for a target clock signal involves not only the circuitry on the microprocessor die, but also external software. The external software may be executed on the microprocessor whose clocks are to be measured, or may be executed on any other microprocessor or microcontroller available in the computer system. Preferably, the external control software determines, or is told by a user, the clocking frequency of the host clock applied to the microprocessor. This host clock frequency information is needed during the calibration process, which is described below. Further, the external software preferably communicates with each of the clock measurement devices on the microprocessor die via the scan chain. Not only can the external software read information, e.g., thermometer codes, from the onboard circuitry, but also the external software controls various operations, e.g., resetting the min/max unit 306, and adjusting the delays of the delay units 200A–D to adjust the time bins 230A–D. The functionality of the external control software becomes clear in a discussion of how, operationally, an uncertainty window measurement is made.

D. Operationally Putting it All Together.

Having now described the circuits on the microprocessor die for making the uncertainty window measurement (except for calibrating those circuits, which is discussed more fully below), the process for determining the uncertainty window is now discussed.

Initially, the external control software preferably sets up the four time boundaries (to create the three time bins 230A–C) as far apart as possible. An exemplary initial setup for the reference clock signals 298A–D may be reference clock 298A equal to G-CLK minus 200 ps, reference clock 298B equal to G-CLK minus 100 ps, reference clock 298C equal to G-CLK plus 100 ps, and reference clock 298D equal to G-CLK plus 200 ps. The exemplary setup of the delay units 200A–D thus gives three time bins, with the outer two bins spanning a time window of 100 ps each, and the inner-most bin spanning a time window of 200 ps. Preferably, the external software initializes the registers in the min/max unit 306, and begins a test run. The test run could measure any number of clock cycles, but preferably only several thousand are measured. During this measurement run, the phase detection circuits 302A–D of the measurement unit compare each cycle of the target clock to the reference clock signals created by the delay units 200A–D. Each comparison generates a thermometer code (see, e.g., FIG. 9) indicative of where a state transition occurred for that particular target clock cycle. The min/max unit 306 preferably monitors each generated thermometer code, keeping an indication of the minimum and maximum measured thermometer code.

Assume for purposes of explanation that a plurality of target clock signals in the exemplary system fall within the first time bin (between G-CLK minus 200 ps and G-CLK minus 100 ps) and likewise a plurality of clock signals fall within the last time bin (G-CLK plus 100 ps to G-CLK plus 200 ps). In this exemplary case, the uncertainty window is broader than the inner-most time bin, which bin has a time width of 200 ps. In this situation, the external control software preferably adjusts the adjustable delay circuits 202 to broaden the inner-most time window, and the measurement process begins again (after reset of the registers in the min/max unit 306).

A more likely situation, however, given the exemplary initial bin setups, is that all the state transitions of the target clock occur within the inner-most bin. This situation would be indicated by having identical minimum and the maximum thermometer codes in the min/max unit 306. Preferably, in this case, the external software adjusts the delay-out circuits 200A–D such that the inner-most time bin spans less time. For example, the reference clock signal 298B could be adjusted to be equal to G-CLK minus 50 ps, and the reference clock signal 298C could be adjusted to be equal to G-CLK plus 50 ps. In this exemplary second setting, the time width of the innermost bin 230B is equal to 100 ps. Thereafter, the external control software preferably initializes the registers in the min/max unit 306 and the measurement process begins again. The determination of the uncertainty window is an iterative process, whereby the time bins 230A–C are adjusted until the uncertainty window is determined. This determination preferably includes setting each of the time windows or bins 230A–C as broad as possible, and then slowly, over several measurement runs, shrinking the size of the inner-most window until its width becomes smaller than the uncertainty window, thus causing the target clock to have state transitions in the outermost bins. At this point, the window is increased in size, over several measurement runs, until all the state transitions of the target clock again fall within the inner-most bin 230B. The width of the inner-most time bin 230B after this iterative process thus represents the width of the uncertainty window of the target clock signal. The determination was made without destructive preparatory work to the microprocessor die, does not require expensive measurement equipment, and can be performed multiple times at relatively little additional expense. Use of the innermost bin to determine the uncertainty window is merely exemplary. One of ordinary skill, now understanding how the uncertainty window is measured, could likewise make the determination using any of the time bins, or multiple bins.

The description above regarding operation of the circuitry assumed that the uncertainty window for the target clock signal would be symmetrical about the G-CLK signal. In practice, there exists a certain amount of skew relative to the G-CLK signal for the target clocks (L2E, L2W and N-CLK). So not only will there be an uncertainty window, but the center of that uncertainty window will most likely not be centered with respect to the state transition of the G-CLK. Instead, because of the skew, the uncertainty window tends to be lopsided toward greater delay. Thus, the initial setup of the time bins 230A–C are preferably shifted sufficiently to account for this lopsided uncertainty window, thus reducing the iterative steps required to find the overall uncertainty window.

Before continuing to a discussion on how to calibrate each of the various components of the onboard circuitry, it is important to realize that the operational method described for determining the uncertainty window, while the preferred implementation, is only one way in which to make the calculation. For example, rather than setting the initial width of the various bins 230A–C to be as wide as possible, one may set the bins initially very small and then slowly, over several rounds of measurement cycles, broaden one or more of the time windows until the uncertainty window is found. Further, the uncertainty window determination need not be made across a single time window or bin 230A–C. Indeed, it is possible to make the uncertainty determination where the target clock signal falls in two bins, and thus the time width those two bins are indicative of the uncertainty of the target clock.

II. Calibration.

A. Calibration Unit 102

Because of inconsistent doping across the microprocessor, inconsistent etching (line widths) across the microprocessor, and thermal characteristics of microprocessors, the operational speed of components on the microprocessor may be different from die to die, and even across the same die. For this reason, each of the jitter measurement circuits 100 comprises a calibration unit 102. In broad terms, the calibration unit 102 is at least partially responsible for establishing a time reference within the jitter measurement circuit 100. More particularly, the calibration unit 102, in combination with the external software, preferably determines a time reference for calibration of various portions of the jitter measurement circuit 100.

Figure 4:
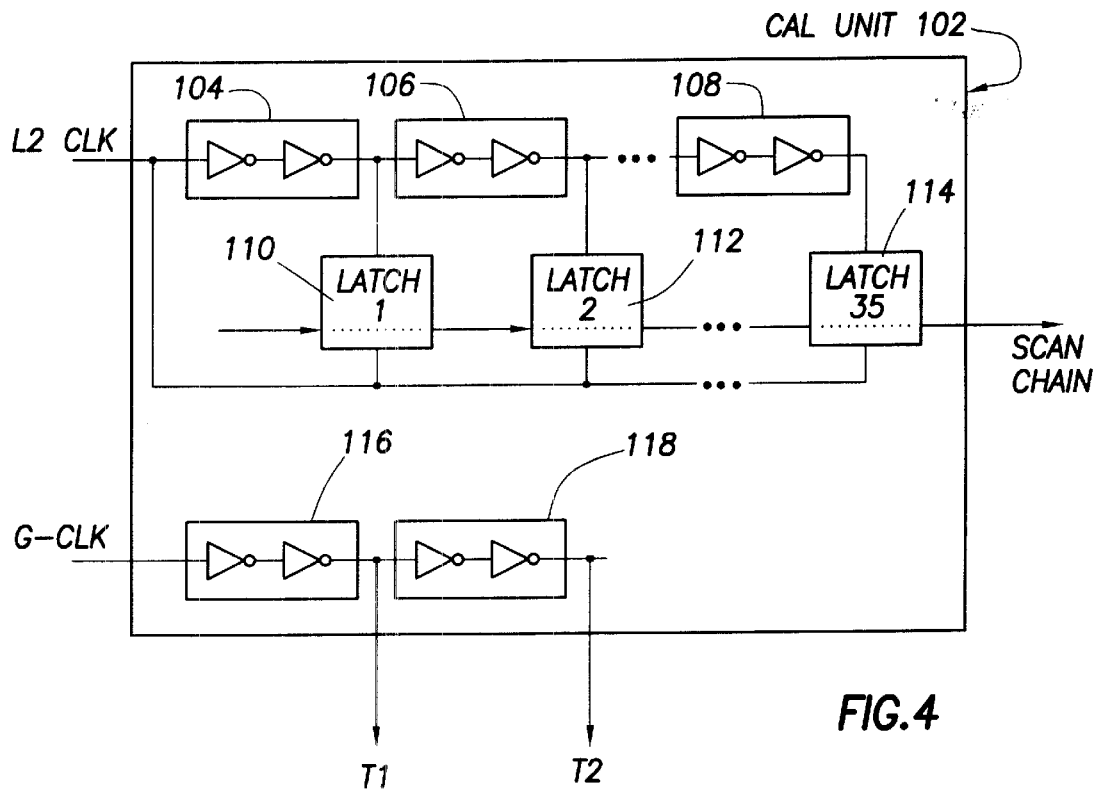
FIG. 4 shows an electrical block diagram of the calibration unit.

FIG. 4 shows a more detailed electrical block diagram of the preferred embodiment of the calibration unit 102. The calibration unit 102 preferably comprises a plurality of inverter pairs, in FIG. 4 shown as inverter pairs 104, 106 and 108. So as not to unduly complicate the drawing, only three such inverter pairs are shown in FIG. 4. However, in the preferred embodiment there are 35 such inverter pairs coupled in series. Determining an absolute time reference in the calibration unit 102 relies on the fact that a particular inverter, if supplied the same voltage, propagates signals from its input to its output at the same speed substantially every time. Thus, inverter pair 104 represents the same amount of propagation delay whether its input, L2CLK, is clocked at 1 GigaHertz or 2 GigaHertz. Similarly, inverter pair 106 through inverter pair 108 all represent substantially the same amount of delay, regardless of the frequency of the signal applied to them. Calibration unit 102 preferably uses this fact as part of the time reference determination. More particularly, during a period within which the calibration unit 102 performs its time reference calculation, the L2CLK (which could be the clock for either the L2E 54, the L2W 56, or an N-CLK) is preferably coupled the first inverter pair 104. The signal applied to the inverter pair 104 propagates through and is immediately coupled to the next inverter pair 106, and so on through the preferred 35 total inverter pairs, if the propagating signal makes it that far.

FIG. 4 also shows a plurality of latch circuits 110, 112 and 114. As with the inverter pairs 104, 106 and 108, only three such latch circuits are shown to simplify the drawing; however, there are preferably 35 of these latch circuits. The latch circuits 110, 112 and 114 are preferably configured to monitor the propagation of the signal between two respective inverter pairs. In particular, latch circuit 110 is adapted to monitor the propagation of the signal between inverter pair 104 and inverter pair 106. Latch circuit 110, and the remaining latch circuits, are preferably adapted latch an asserted condition when a signal crosses the boundary between inverter pairs. Thus, as a signal propagates along the inverter pair chain, each latch circuit (110, 112 and 114) latches an indication that the signal has propagated through the related inverter pair. Latching is allowed to continue for some known period of time relative to the clock signal that is applied to the inverter pair chain. In the preferred embodiment, the latch circuits are active for one full clock period of the clock signal applied to the inverter pair chain. Thus, there will be a number of latch circuits which have latched an asserted state to indicate the propagation of the signal of interest, and others that have not. FIG. 5A shows a series of 35 zeros, which could be the initial state of each of the latches 110, 112 and 114 of the calibration unit 102 just prior to a clock signal propagating along the inverter pair chain. It must be understood that having zeros as the initial state, while the preferred embodiment, is only exemplary, and it is equally feasible to design the latch circuits to all initially have a logic one state. Sometime after initialization, the clock signal is allowed to propagate along the inverter pair chain. As the asserted state of the clock signal crosses the boundary between inverter pairs, the corresponding latch circuit latches that asserted state. It is preferred that the inverter pair chain be designed such that the clock signal applied propagate through at least one of the inverter pairs. Likewise, it is preferred that the inverter pair chain be long enough that even at the slowest possible clocking frequency (and therefore the longest possible propagation time based on the period of that frequency), that the signal propagating along the inverter pair chain not quite or just make it past the last inverter pair. As discussed, in the preferred embodiments there are 35 of these inverter pairs in the chain.

After the clock signal has been applied to the inverter pair chain for a particular period of time, the latches 110, 112 and 114 are disabled, preferably by de-assertion of the L2CLK signal as indicated in FIG. 4. Thus, after their de-assertion, some of the latch circuits 110, 112 and 114 may have latched asserted states, and others of those latch circuits have not. An exemplary resulting configuration of ones and zeros stored in the latch circuits is shown in FIG. 5B. The resulting string of ones and zeros is referred to as a "thermometer code." In FIG. 5B, in the exemplary description of a cycle of the calibration unit 102, twenty-five of the latch circuits latched in a logic "1" indicating the propagation of the clock signal between their respective inverter pairs.

Preferably the external control software knows the host clock frequency, and further preferably has access to the thermometer code stored in the latch circuits 110, 112 and 114 by way of the scan chain. In the preferred embodiment, each of the latch circuits of the calibration unit 102 resides on the scan chain. After the clock has propagated along the inverter pair chain and the corresponding latch circuits have latched the asserted states, indicating the maximum progress of that propagation during a predetermined period, that information is preferably transferred to the software program external to the microprocessor. In the exemplary thermometer code of FIG. 5B, the clock signal propagated through twenty-five of the inverter pairs during the propagation period. If an exemplary clock period is 1000 ps, then the propagation time through each of the inverter pairs is approximately $1/25^{th}$ of the period of the applied clock, or 40 ps.

What has thus been determined, using the calibration unit 102 and the external software, is the propagation time through an inverter pair, which does not change as a function of the clocking frequency. In the example given, the propagation time through one inverter pair is $1/25^{th}$ of the overall period of the applied clock. This information is preferably stored in the software for use in calibrating other portions of the jitter measurement circuit 100, which are discussed below.

Referring still to FIG. 4, the calibration unit 102 preferably couples to the clock for the core region 52, namely the G-CLK. This G-CLK preferably couples to two inverter pairs 116 and 118. At the boundary between inverter pair 116 and 118, a time reference is tapped, indicated in FIG. 4 as T1. Likewise, at the downstream side of the second inverter pair 118, a second time reference is tapped, given the designation T2. As shown in FIG. 3, these signals T1 and T2 couple to each of the delay units 200A–200D. The phase difference between the T1 signal and the T2 signal is used to calibrate each of the delay units 200A–D. In the example calibration given with regard to FIG. 5B, because of the phase difference, the difference in time between assertions of the T1 and T2 signals would be $1/25^{th}$ of the overall clock period. However, it must be understood that this is only exemplary and the fraction of the overall clock period that the propagation through an inverter pair represents may change across multiple microprocessor dies, and will change as the frequency of host clocks applied to the microprocessor changes.

Summarizing before continuing, the calibration unit 102 of the jitter measurement circuit 100 is responsible for determining a time reference relative to the propagation delay across an inverter pair. That determination is made by allowing a clock signal to propagate along a series of inverter pairs. Between each inverter pair, a latch circuit latches an asserted state as the applied clock propagates along the inverter pairs. After some known time, preferably one complete clock period of the host clock, the latching circuits are disabled. By reading how many of the latching circuits indicate an asserted state, as compared to how many did not, a thermometer code is created. By shifting that thermometer code off chip using the scan chain, external software, which is aware of the frequency and therefore the period of the host clock, calculates percentage of the host clock period that the propagation delay of each inverter pair represents. Further, the calibration unit 102 creates two signals which couple to the delay units 200A–D of the jitter measurement circuit, where those signals differ in phase by the propagation delay associated with one inverter pair. Because the external software, in combination with the internal hardware, has determined how much time relative to the period of the host clock each inverter pair propagation delay represents, the known phase delay between the T1 and T2 signals preferably is used in downstream circuitry for calibration purposes.

B. Calibration of the Delay Units.

The preferred embodiment calibrates the delay circuits prior to setting up the overall jitter measurement circuit 100 for operation. Referring to FIG. 7, calibration of the adjustable delay circuit 202 preferably takes place by applying a time delayed version of the G-CLK signal to the delay circuits (204, 206 and 208) and determining the amount of delay required to have that G-CLK match or lock to the T1, T2, and the G-CLK signals. As discussed with respect to the calibration unit 102, the T1 signal preferably represents the G-CLK with at least two inverter delays, and the T2 signal preferably represents the G-CLK with at least four inverter delays.

1. Selection of the Coarse Delay Setting.

As indicated in FIG. 7, the preferred embodiment of the adjustable delay circuit 202 comprises not only a coarse delay circuit 204, but also the fine delay circuits 206, 208. As the name implies, the function of the coarse delay circuit 204 is to provide a coarse setting in the overall setup of the each particular adjustable delay circuit 202.

Referring again to FIG. 8, there is shown the preferred embodiment of the coarse delay circuit 204. In particular, shown are three of the preferred seventeen inverter quadruplets numbered 232, 234 and 236. Preferably, the inverter quadruplets 232, 234 and 236 are connected in series. Each output signal of each inverter quadruplet is preferably coupled to the input signals of the 16-by-1 multiplexer 238. As is the function of a multiplexer, based on the control inputs 240 of the multiplexer, only one of the 16 inputs is coupled to the output line, which in the preferred embodiment then couples to the fine delay circuits 206, 208.

Inasmuch as the coarse delay circuit 204 is in the same relative proximity as the calibration unit 102, no calibration is required in the coarse delay unit. That is, because each inverter quadruplet 232, 234 and 236 comprises four inverters coupled in series, and because in the calibration unit 102 a determination was made as to the propagation time of inverter pairs as related to applied clock period, the time delay associated with each inverter quadruplet is thus a natural extension of that determination.

Operationally however, the coarse delay circuit 204 is preferably controlled by a plurality of logic gates on the microprocessor die configured to be a state machine. In particular, the calibration and adjustment delay control circuit 222 in each of the adjustable delay circuits 202 preferably contains the state machine 310 which controls the coarse delay circuit 204. For a particular setup of the overall adjustable delay circuit, the state machine 310 starts by selecting the minimum delay (the multiplexer couples the output of the first inverter quadruplet 232 to its output) and then increases the delay until one of the phase detectors (216, 218 or 220 in the adjustable delay circuit 202, whichever is operational) indicates that the reference clock signal 298 crosses the particular reference (T1, T2 or G-CLK). After a determination is made that the reference clock signal 298 has crossed (stated otherwise, the reference clock phase delay becomes longer than the clock signal of interest), the state machine preferably backs up one inverter quadruplet tap, and then the fine delay circuits begin to find a lock for calibration purposes.

2. Calibration of the Fine Delay Circuits 206, 208.

Calibration of the delay circuits 206, 208 of the adjustable delay circuit 202 preferably involves applying the G-CLK signal to the delay circuits set up for maximum delay. The resulting reference clock signal 298 is preferably first compared to the T2 signal. If the reference clock signal does not match the T2 signal (that is, if the reference clock signal does not lock to the T2 signal the delay is decreased and the comparison is run again. Decreasing the delay involves adding active parallel transistors to the fine delay circuits. In the preferred embodiment, a decrease in delay means adding a single set of parallel transistors in each fine delay circuit sequentially. Once the corresponding single set of parallel transistors are added in each fine delay circuit, a second single set of parallel transistor added to each sequentially. This process continues until the delay output signal 298 matches or locks to the T2 signal. From the control aspect, either increasing or decreasing the delay in the fine delay circuits 206 and 208 involves the external software communicating to the control circuit 252 (FIG. 6). Preferably, one particular location in the scan chain (one bit) indicates the external software's desire to increase delay. Likewise, individual locations in the scan chain (individual bits) also indicate the external software's desire to lock to the T1 signal, lock to the T2 signal, lock to the G-CLK signal and increase the delay. Preferably, the control circuit 252 houses latches that reside on the scan chain, and the resulting series of zeros and ones are interpreted as commands that are passed from the control circuit 252 to the adjustable delay circuit 202. Referring again to FIG. 7, it is seen that the T1 lock signal 224, the T2 lock signal 226, the lock G-CLK signal 244, the increase delay signal 228, and the decrease delay signal 246 all couple to the calibration and adjustable delay control circuit 222. The lock signals 224, 226 and 244 are all preferably used during the calibration process discussed below. Moreover, the lock G-CLK signal 244 may be used during initial bin setup prior to a measurement run. That is, the external software may request that any particular delay unit 200 first lock to the G-CLK signal, and then request an increase in delay or decrease in delay, using signals 228 and 246 respectively, so as to set the time bins in their proper location.

Once the delay-out signal 298 locks to the T2 signal, the settings for each circuit of the delay circuits 206, 208 are read and stored. Referring still to FIG. 7, the scan chain, after running through the coarse delay setting state machine 310, also runs through each of the fine delay control circuits 212, 214. Preferably, each delay setting in each fine delay control circuit 212, 214 may be read by the external software across the scan chain. In particular, the settings are shifted out of the microprocessor via the scan chain and stored by the external control software. In the preferred embodiment, each fine delay circuit 206, 208 has six levels of digitally controlled delay. Given that the preferred embodiment also has eight overall fine delay circuits, there are thus forty-seven possible steps or taps that may be adjusted to tune the overall delay circuit to lock to the T2 signal. The external software preferably notes or stores the number of bits or taps it took to lock the G-CLK signal to the T2 signal. For example, the number of bits (representing an amount of delay) could be twenty-nine.

The second stage of calibration of the delay circuit 202 involves propagating the G-CLK signal along the delay circuits (to create the reference clock signal 298) and matching or locking the reference clock signal 298 to the T1 signal. Because the T1 signal is preferably two inverter delays ahead of the T2 signal, the settings for the delay circuits 206, 208 need not be reset during this second phase of the calibration procedure. Rather, additional transistor pairs are added to the fine delay circuits 206, 208, in a sequential manner, until the reference clock signal 298 matches or locks to the T1 signal. Once this locking has taken place, the software external to the microprocessor preferably reads the delay settings from the delay control circuits 212, 214 across the scan chain, as previously noted. The difference in the settings required to lock the G-CLK to the T1 and T2 signals is thus directly proportional to the known delay between the T1 and the T2 signals. As an example only, and without limitation, assume that locking the reference clock signal 298 to the T1 signal required assertion of 39 taps in the fine delay circuits. Further assume that locking the reference clock signal to the T2 signal required assertion of 29 taps in the fine delay circuits (more delay). Also assume that it was previously determined that one inverter pair (the difference between T1 and T2) represents 40 ps. In this example, ten taps of programmed delay thus represent 40 ps, and therefore each tap of the fine delay circuits 206, 208 represent 4 ps of delay. This information is then used by the software during normal operation in setting the width of the time windows 230A–C, as discussed in Section I above.

Summarizing, the adjustable delay circuit 202 is calibrated by propagating the G-CLK signal through a series of programmable delay elements and matching or phase locking to the T1 and T2 signals created in the calibration unit 102. Because the time delay between the T1 and T2 signals is known, the time represented by the difference in settings of the fine delay circuits 206, 208 between locking the G-CLK to the T1 signal and locking the G-CLK to the T2 signal is thus known. Because in the preferred embodiment the delay elements or taps of the fine delay circuits 206, 208 are preferably designed in such a way that their contribution to the overall delay is the same, the difference between the number of delay elements required to lock to the T1 and T2 signals is directly proportional to the propagation delay time of two inverters. In the example above, the difference was ten taps representing a time difference (for two inverter pairs) of 40 ps. Thus, each tap represents 4 ps of delay in the exemplary system.

Referring again to FIG. 6, the control circuit 252 couples to the adjustable delay circuit 202. The control circuit 252 is preferably responsible for control of the adjustable delay circuit 202 by means of the exchange of several control signals. In particular, the T1 lock signal 224 commands the adjustable delay circuit to lock to the T1 signal (part of the calibration process). Likewise, the T2 lock signal 226 commands the adjustable delay circuit to lock to the T2 signal. Outside the context of calibrating the adjustable delay circuit, the increase delay signal 228 and the decrease delay signal 246 are used by the control circuit 252 to set the adjustable delay for a particular jitter measurement. Further, the lock-G-CLK 244 signal may be used as part of the measurement process. Since the skew and jitter place the state transitions of the target clock near or around the G-CLK's signal, the external software can force the adjustable delay circuit 202 to lock to that G-CLK signal, and then impose additional time lead or lag from that point.

In summary, the delay units 200A–D are responsible for creating a plurality of reference signals by the use of an adjustable delay circuit 202. However, before creating the various reference signals, the adjustable delay circuit 202 elements must be calibrated. In the preferred embodiment, the calibration is by locking a G-CLK signal propagated through those delay elements to both the T1 and the T2 signals created in the calibration unit 102. In so doing, external software is capable of discerning how many fine delay taps are required for the known amount of delay, thus attributing portion of the delay to each delay tap. Once the adjustable delay circuit 202 is calibrated, the reference clock signal is created and is adjustable by external software by the shifting of command elements across the scan chain.

Although the preferred embodiments envision measuring the uncertainty window of each of the L2E 54 and L2W 56 clocks, an alternative embodiment also envisions measuring the uncertainty window associated with the N-clock region 58. This measurement could be made by placing a third jitter measurement circuit 100 within the N-clock region, but preferably is done by multiplexing the clock signal from the N-clock region 54 to one of the jitter measurement circuits 100A–B.

The above discussion is meant to be illustrative of the principles and various embodiments of the present invention. Numerous variations and modifications will become apparent to those skilled in the art once the above disclosure is fully appreciated. For example, the bulk of the disclosure above is directed to implementing the uncertainty measurement on a microprocessor die; however, knowing the uncertainty window of clock signals may be beneficial for many types of electronic devices such as microcontrollers, digital signal processors, and the like. The description above and the claims below should be read, where appropriate, to cover not only microprocessors, but any such electronic device. Further, the preferred embodiments describe defining time windows or bins between corresponding features of the reference clock signals. These corresponding features are shown to be rising edges of the various reference clock signals; however, one of ordinary skill in the art, now understanding how the on-die uncertainty measurement is made could easily define these time windows or bins between other features of the reference clock signals including non-corresponding rising edges, rising and falling edges, falling edges and the like. Moreover, the preferred embodiments describe a state machine for control of the coarse delay circuit. However, any or all of the functionality described in the software may be implemented in hardware either on the microprocessor die or in other physical locations. Relatedly, though the state machine is the preferred embodiment, the functionality embodied in that state machine could likewise be implemented in software and still fall within the purview of the invention. Further still, only four reference clock signals, and correspondingly three time bins, are disclosed; however, one of ordinary skill in the art now understanding how the preferred embodiments of the present invention work, could easily design a system having greater or fewer reference clocks, and correspondingly greater or fewer time bins, and such a measurement circuit would still be within the purview of the invention. It is intended that the following claims be interpreted to embrace all such variations and modifications.

What is claimed is:

1. A method of measuring an uncertainty window within which a target clock signal of an electronic device makes state transitions, the method comprising:

defining a time window between features of a first and second reference clock signals; and comparing within the electronic device a plurality of cycles of the target clock signal to the reference clock signals to determine whether the target clock signal makes state transitions within the time window;

wherein comparing the reference clock signals to the target clock signal comprises:
    phase detecting the first reference clock signal against the target clock signal to determine whether the target clock signal makes its state transition before or after the first reference clock signal; and
    phase detecting the second reference clock signal against the target clock signal to determine whether the target clock signal makes its state transition before or after the second reference clock signal, and wherein the target clock signal makes state transitions within the time window if those transitions are detected to be after the first reference clock signal and before the second reference clock signal.

2. A microprocessor, comprising:
    a clock domain region having a target clock; and
    a jitter measurement circuit associated with the clock domain region;
    wherein the jitter measurement circuit measures an uncertainty window within which the cache clock makes state transitions, jitter measurement circuit comprises:
        a plurality of delay units, each of the delay units comprising an inverter chain having a programmable delay, the delay units creating a plurality of reference clock signals, each reference clock signal having the same frequency but differing in phase relationship; and
        a measurement unit coupled to the plurality of reference clock signals and the target clock, and wherein the measurement unit compares the target clock to the plurality of reference clock signals to determine the uncertainty window of the target clock.

3. The microprocessor as defined in claim 2 wherein the inverter chain further comprises:
    a coarse delay circuit coupled to the host clock, wherein the coarse delay circuit provides a programmable delay in a first time range; and
    a fine delay circuit coupled to the coarse delay circuit, wherein the fine delay circuit provides a programmable delay in a second time range which is smaller than the first time range.

4. The microprocessor as defined in claim 3 wherein the coarse delay circuit further comprises:
    a plurality of delay elements each having a delay input signal and a delay output signal, the plurality of delay elements coupled in series, and the first delay element having its delay input signal coupled to a host clock;
    a multiplexer having a plurality of data inputs coupled one each to the delay output signals of the plurality of delay elements coupled in series; and
    wherein the coarse delay circuit implements its programmable delay by coupling only one of the data inputs of the multiplexer to a data output of the multiplexer responsive a plurality of control signals applied to the multiplexer.

5. The microprocessor as defined in claim 4 wherein the delay elements of the coarse delay circuit further comprises four inverters coupled in series.

6. The microprocessor as defined in claim 4 wherein the plurality of delay elements of the coarse delay circuit further comprises sixteen delay elements.

7. The microprocessor as defined in claim 4 wherein the multiplexer having a plurality of data inputs further comprises a multiplexer having sixteen data inputs.

8. The microprocessor as defined in claim 4 wherein the coarse delay circuit implements a delay varying between 80 and 3100 picoseconds.

9. The microprocessor as defined in claim 3 wherein the fine delay circuit further comprises a of plurality of adjustable delay elements each having a delay input signal and a delay output signal, the plurality of adjustable delay elements coupled in series, and the first delay element having its delay input signal coupled to the coarse delay circuit.

10. The microprocessor as defined in claim 9 wherein the adjustable delay elements further comprise an inverter having a plurality of transistors that may be selectively added to increase the inverter's propagation speed.

11. The microprocessor as defined in claim 10 wherein the fine delay circuit implements delay ranging from 200 to 500 picoseconds.

12. A microprocessor, comprising:
    a clock domain region having a target clock;
    a jitter measurement circuit associated with the clock domain region;
    wherein the jitter measurement circuit measures an uncertainty window within which the cache clock makes state transitions, the jitter measurement circuit comprises:
        a plurality of delay units creating a plurality of reference clock signals, each reference clock signal having the same frequency but differing in phase relationship; and
        a measurement unit coupled to the plurality of reference clock signals and the target clock, and wherein the measurement unit compares the target clock to the plurality of reference clock signals to determine the uncertainly window of the target clock; and
    a calibration unit configured to provide signals for calibration of the jitter measurement unit, wherein the calibration unit comprises:
        a plurality of inverter pairs coupled in series, and a first inverter pair in the series coupled to a clock signal, wherein a number of inverter pairs a propagating signals passes through in one period of the clock signal is indicative of speed of the inverter pairs in the calibration unit;
        a second plurality of inverter pairs coupled to the clock signal;
        a first tap signal coupled to the second plurality of inverters between a first inverter pair and a second inverter pair;
        a second tap signal coupled to the second plurality of inverters after the second inverter pair; and
        wherein the phase difference between the first and second tap signals is proportional to a known portion of the clock period.

13. A method of measuring an uncertainty window within which a target clock signal on a microprocessor die makes state transitions, the method comprising;
    generating on the microprocessor die a first and second reference clock signals having the same frequency but differing in phase relationship, wherein generating the first and second reference clock signals comprises:
        coupling a core clock signal to a first adjustable delay chain;
        delaying the core clock by a first length of time with the first adjustable delay chain to create the first reference clock signal;
        coupling the core clock signal to a second adjustable delay chain; and delaying the core clock by a length of time greater than the first length of time with the second adjustable delay chain to create the second reference clock signal by:
applying the core clock to a plurality of buffers coupled in series; and
adjusting a desired delay for each buffer of the plurality of buffers by controlling the amount of operational transistor area of buffer;
defining a time window between features of the first and second reference clock signals;
comparing on the microprocessor die a plurality of cycles of the target clock signal to the reference clock signals to determine whether the target clock signal makes state transitions within the time window;
adjusting the time window; and
repeating the comparing step and adjusting step to determine the uncertainty window.

14. The method of measuring an uncertainty window as defined in claim 13 wherein applying the core clock to a plurality of buffers further comprises applying the core clock to a plurality of programmable delay inverting buffers.

15. A method of measuring an uncertainty window within which a target clock signal on a microprocessor die makes state transition, the method comprising:
generating on the microprocessor die a first and second reference clock signals having the same frequency but differing in phase relationship;
defining a time window between features of the first and second reference clock signals;
comparing on the microprocessor die a plurality of cycles of the target clock signal to the reference clock signals to determine whether the target clock signal makes state transitions within the time window;
adjusting the time window; and
repeating the comparing step and adjusting step to determine the uncertainty window;
wherein adjusting the time window comprises adjusting the phase relationship of the first and second reference clock signals, setting the time window smaller than an anticipated uncertainty window, comparing the plurality of cycles of the target clock signal to the first and second reference clock signals, and expanding the time window until in the comparison of the plurality of target clock cycles has substantially all the state transitions of the target clock signal within the time window.

16. A method of measuring an uncertainty window within which a target clock signal on a microprocessor die makes state transitions, the method comprising;
generating on the microprocessor die a first and second reference clock signals having the same frequency but differing in phase relationship;
defining a time window between features of the first and second reference clock signals;
comparing on the microprocessor die a plurality of cycles of the target clock signal to the reference clock signals to determine whether the target clock signal makes state transitions within the time window;
adjusting the time window; and
repeating the comparing step and adjusting step to determine the uncertainty window;
wherein adjusting the time window comprises adjusting the phase relationship of the first and second reference clock signals, setting the time window larger than an anticipated uncertainty window, comparing the plurality of cycles of the target clock signal to the first and second reference clock signals, contracting the time window until in the comparison of the plurality of target clock cycles has transitions of state outside the time window, then expanding the time window until the comparison of the plurality of clock cycles has substantially all the state transitions occur within the time window.

17. A system for measuring an uncertainty window of a target clock signal of a microprocessor, the system comprising:
a measurement circuit on the die of the microprocessor, wherein the measurement circuit further comprises:
a plurality of delay units each coupled to a host clock and creating the plurality of reference clock signals by selectively phase delaying the host clock signal by each of the delay units, wherein each of the plurality of delay units further comprises:
a coarse delay circuit coupled to the host clock, wherein the coarse delay circuit provides a programmable delay in a first time range; and
a fine delay circuit coupled to the coarse delay circuit, wherein the fine delay circuit provides a programmable delay in a second time range which is smaller than the first time range; and
a measurement unit coupled to the plurality of reference clock signals and the target clock signal, and wherein the measurement unit compares the plurality of reference clock signals to the target clock signal to determine the uncertainty window;
an external measurement system coupled the measurement circuit by way of a scan chain of the microprocessor, and wherein the external measurement system executes software adapted to control the measurement circuit through the scan chain;
wherein the external measurement system is further adapted to adjust a phase relationship of a plurality reference clock signals having varying phase, the plurality of reference clock signals define a plurality of time windows between corresponding features; and
wherein the measurement circuit compares the target clock signal to the plurality of time windows to determine the uncertainty window of the target clock signal.

18. The system for measuring the uncertainty window as defined in claim 17 wherein the coarse delay circuit further comprises:
a plurality of inverter quadruplets comprising four inverters coupled in series, each inverter quadruplet having a delay input signal and a delay output signal, the plurality of inverter quadruplets coupled in series, and a first inverter quadruplet having its delay input signal coupled to the host clock;
a multiplexer having a plurality of data inputs coupled one each to the delay output signals of the plurality of inverter quadruplets; and
wherein the coarse delay circuit implements its programmable delay by coupling only one of the data inputs of the multiplexer to a data output of the multiplexer responsive a plurality of control signals applied to the multiplexer.

19. A system for measuring an uncertainty window of a target clock signal of a microprocessor, the system comprising:
- a measurement circuit on the die of the microprocessor, wherein the measurement circuit further comprises:
  - a plurality of delay units each coupled to a host clock and creating the plurality of reference clock signals by selectively phase delaying the host clock signal by each of the delay units, and
  - a measurement unit coupled to the plurality of reference clock signals and the target clock signal, and wherein the measurement unit compares the plurality of reference clock signals to the target clock signal to determine the uncertainty window;
- an external measurement system coupled the measurement circuit by way of a scan chain of the microprocessor, and wherein the external measurement system executes software adapted to control the measurement circuit through the scan chain;
- wherein the external measurement system is further adapted to adjust a phase relationship of a plurality reference clock signals having varying phase, the plurality of reference clock signals define a plurality of time windows between corresponding features;
- wherein the measurement circuit compares the target clock signal to the plurality of time windows to determine the uncertainty window of the target clock signal; and
- wherein the measurement unit comprises a minimum/maximum unit coupled to the external system by way of the scan chain, and wherein the minimum/maximum unit is adapted to determine a minimum and maximum thermometer codes in each measurement run.

20. In system for measuring on the die of the electronic device an uncertainty window within which a target clock signal may make a state transition, a method of calibrating a measurement circuit comprising:
- generating a first and second calibration signal, each calibration signal having the same frequency, but differing in phase relationship by a known period of time, wherein generating the first and second calibration signal comprises:
  - applying a host clock signal to a first delay element having known propagation delay to create the first calibration signal; and
  - applying the first calibration signal to a second delay element having known propagation delay to create the second calibration signal;
  - wherein applying the host clock to the first delay element and applying the first calibration signal to the second delay element comprises applying the host clock and first calibration signal to respective inverter pairs having the same propagation delay;
- phase locking an output signal of a programmable delay chain to the first calibration signal;
- noting a number of programmable taps required to phase lock to the first calibration signal;
- phase locking the output signal of the programmable delay chain to the second calibration signal;
- noting the number of programmable taps required to phase lock to the second calibration signal;
- attributing the difference in the number of taps to lock to the first and second calibration signal to the known period of time; and thereby
- attributing to each tap portion of the known period of time.

21. In system for measuring on the die of the electronic device an uncertainty window within which a target clock signal may make a state transition, a method of calibrating a measurement circuit comprising:
- generating a first and second calibration signal, each calibration signal having the same frequency, but differing in phase relationship by a known period of time;
- phase locking an output signal of a programmable delay chain to the first calibration signal;
- noting a number of programmable taps required to phase lock to the first calibration signal;
- phase locking the output signal of the programmable delay chain to the second calibration signal;
- noting the number of programmable taps required to phase lock to the second calibration signal;
- attributing the difference in the number of taps to lock to the first and second calibration signal to the known period of time; and thereby
- attributing to each tap a portion of the known period of time.
- wherein the phase locking steps comprise:
  - propagating a signal along the delay chain set up for a delay longer than required to lock to the respective signal;
  - comparing state transitions of the signal to the respective calibration signal; and if the comparison reveals the propagating signal makes a state transition after the respective calibration signal;
  - increasing the propagation speed along the delay chain; and
  - repeating the comparing step and the increasing the propagation speed step until the signal makes a state transition at substantially the same time as the respective calibration signal.

22. In system for measuring on the die of the electronic device an uncertainty window within which a target clock signal may make a state transition, a method of calibrating a measurement circuit comprising:
- generating a first and second calibration signal, each calibration signal having the same frequency, but differing in phase relationship by a known period of time;
- phase locking an output signal of a programmable delay chain to the first calibration signal;
- noting a number of programmable taps required to phase lock to the first calibration signal;
- phase locking the output signal of the programmable delay chain to the second calibration signal;
- noting the number of programmable taps required to phase lock to the second calibration signal, wherein noting the number of programmable taps comprises shifting tap information off the die of the electronic device by way of a serial communication pathway;
- attributing the difference in the number of taps to lock to the first and second calibration signal to the known period of time; and thereby
- attributing to each tap a portion of the known period of time.

23. The method of calibrating the measurement circuit as defined in claim 22 wherein shifting the tap information off the die further comprises shifting the tap information off the die by way of a scan chain.

24. A microprocessor comprising:
- a core region adapted to execute software routines;
- a cache region acting as a working memory for the core region, and the cache region also having a cache clock; and a measurement means on the microprocessor die for determining skew and jitter of the cache clock, wherein the measurement means comprises:
  a reference signal generating means for creating a reference clock signal; and
  a comparison means for comparing the reference clock signal to the cache clock to determine the skew and jitter of the cache clock, wherein the reference signal generating means comprises:
    an adjustable delay means coupled to a host clock for providing an adjustable time delay of the host clock signal wherein the adjustable delay means comprises a coarse delay means coupled to the host clock for providing an adjustable time delay having a first range and a fine delay means coupled to the coarse delay means for providing an adjustable delay having a range smaller than that of the first range; and
    a control means coupled to the adjustable delay means and to a scan chain, wherein the control means adjusts the time delay of the adjustable delay means responsive to commands communicated over the scan chain.

25. A microprocessor comprising:
a core region adapted to execute software routines;
a cache region acting as a working memory for the core region, and the cache region also having a cache clock; and
a measurement means on the microprocessor die for determining skew and jitter of the cache clock, wherein the measurement means comprises:
  a reference signal generating means for creating a reference clock signal; and
  a comparison means for comparing the reference clock signal to the cache clock to determine the skew and jitter of the cache clock wherein the comparison means comprises:
    a phase detection means coupled to the reference clock signal and the cache clock, and wherein the phase detection means for detecting the phase relationship between the reference clock signal and the cache clock; and
    a means for determining the maximum and minimum detected phase relationship.

26. A method for determining an uncertainty window within which a target clock signal of an electronic device makes state transitions, the method comprising:
  generating on a microprocessor die a first, second, third and fourth reference clock signals having the same frequency but differing in phase relationship, wherein generating the first, second, third and fourth reference clock signals on the microprocessor die comprises:
    coupling a core clock signal to a first adjustable delay chain;
    delaying the core clock by a first length of time with the first adjustable delay chain to create the first reference clock signal;
    coupling the core clock signal to a second adjustable delay chain;
    delaying the core clock signal by a second length of time greater than the first length of time with the second adjustable delay chain to create the second reference clock signal;
    coupling the core clock signal to a third adjustable delay chain;
    delaying the core clock signal by a third length of time greater than the second length of time with the third adjustable delay chain to create the third reference clock signal;
    coupling the core clock signal to a fourth adjustable delay chain; and
    delaying the core clock signal by a fourth length of time greater than the second length of time with the fourth adjustable delay chain to create the fourth reference clock signal;
  defining a first time bin between respective features of the first and second reference clock signals, defining a second time bin between respective features of the second and third reference clock signals, and defining a third time bin between respective features of the third and fourth reference clock signals;
  comparing on the microprocessor die a plurality of cycles of the target clock signal to the reference clock signals to determine in which bin the target clock signal makes it state transitions;
  adjusting the phase relationship of at least one of the reference clock signals, and thereby adjusting the time width of at least one time bin; and
  repeating the adjusting step and the comparing step until the uncertainty window is determined.

27. The method of measuring an uncertainty window as defined in claim 26 wherein delaying the core clock with the first, second, third and fourth adjustable delay chain further comprises:
  applying the core clock to a plurality of buffers coupled in series; and
  adjusting a desired delay for each buffer of the plurality of buffers by controlling the amount of transistor area of buffer.

28. The method of measuring an uncertainty window as defined in claim 27 wherein applying the core clock to a plurality of buffers further comprises applying the core clock to a plurality of programmable delay inverting buffers.

29. A method for determining an uncertainty window within which a target clock signal of an electronic device makes state transitions, the method comprising:
  generating on a microprocessor die a first, second, third and fourth reference clock signals having the same frequency but differing in phase relationship;
  defining a first time bin between respective features of the first and second reference clock signals, defining a second time bin between respective features of the second and third reference clock signals, and defining a third time bin between respective features of the third and fourth reference clock signals;
  comparing on the microprocessor die a plurality of cycles of the target clock signal to the reference clock signals to determine in which bin the target clock signal makes it state transitions;
  adjusting the phase relationship of at least one of the reference clock signals, and thereby adjusting the time width of at least one time bin, wherein adjusting the time bins comprises:
    adjusting the phase relationship of at least one of the first, second, third and fourth reference clock signals;
    setting at least one time bin smaller than an anticipated uncertainty window;
    comparing the plurality of cycles of the target clock signal to the at least one time bin; and
    expanding the at feast one time bin until in the comparison of the plurality of target clock cycles has substantially all the state transitions of the target clock signal within the at least one time bin; and
  repeating the adjusting step and the comparing step until the uncertainty window is determined.

30. A method for determining an uncertainty window within which a target clock signal of an electronic device makes state transitions, the method comprising:

generating on a microprocessor die a first, second, third and fourth reference clock signals having the same frequency but differing in phase relationship;

defining a first time bin between respective features of the first and second reference clock signals, defining a second time bin between respective features of the second and third reference clock signals, and defining a third time bin between respective features of the third and fourth reference clock signals;

comparing on the microprocessor die a plurality of cycles of the target clock signal to the reference clock signals to determine in which bin the target clock signal makes it state transitions;

adjusting the phase relationship of at least one of the reference clock signals, and thereby adjusting the time width of at least one time bin, wherein adjusting the time bins comprises:

adjusting the phase relationship of at least one of the first, second, third and fourth reference clock signals;

setting at least one time bin larger than an anticipated uncertainty window;

comparing the plurality of cycles of the target clock signal to the at least one time bin;

contracting the time width of the at least one time bin until in the comparison of the plurality of target clock cycles has transitions of state outside the at least one time bin; then expanding the time window until the comparison of the plurality of clock cycles has substantially all the state transitions occur within the at least one time bin; and repeating the adjusting step and the comparing step until the uncertainty window is determined.

31. A microprocessor, comprising:

a cache region having a cache clock;

a jitter measurement circuit associated with the cache region, wherein the jitter measurement circuit measures an uncertainty window within which the cache clock makes state transitions;

wherein the jitter measurement circuit further comprises:

four delay units creating a four reference clock signals, each reference clock signal having the same frequency but differing in phase relationship;

a measurement unit coupled to the four reference clock signals and the cache clock, and wherein the measurement unit compares the cache clock to the plurality of reference clock signals to determine the uncertainty window of the cache clock; and a calibration unit coupled to the delay unit and configured to provide signals for calibration of the jitter measurement unit.

wherein each of the delay units comprises an inverter chain having a programmable delay.

32. The microprocessor as defined in claim 31 wherein the inverter chain further comprises:

a coarse delay circuit coupled to the host clock, wherein the coarse delay circuit provides a programmable delay in a first time range; and a fine delay circuit coupled to the coarse delay circuit, wherein the fine delay circuit provides a programmable delay in a second time range which is smaller than the first time range.

33. The microprocessor as defined in claim 32 further comprising:

said coarse delay circuit provides a programmable delay in the range of 80 to 3100 picoseconds; and said fine delay circuit provides a programmable delay in a range of 200 to 500 picoseconds.

34. The microprocessor as defined in claim 32 wherein the coarse delay circuit further comprises:

sixteen inverter quadruplets each having a delay input signal and a delay output signal, the sixteen inverter quadruplets coupled in series, and a first inverter quadruplet having its delay input signal coupled to a host clock;

a multiplexer having a sixteen data inputs coupled one each to the delay output signals of the inverter quadruplets; and wherein the coarse delay circuit implements its programmable delay by coupling only one of the data inputs of the multiplexer to a data output of the multiplexer responsive a plurality of control signals applied to the multiplexer.

35. The microprocessor as defined in claim 32 wherein the fine delay circuit further comprises eight adjustable delay elements each having a delay input signal and a delay output signal, the plurality of adjustable delay elements coupled in series, and the first delay element having its delay input signal coupled to the coarse delay circuit.

36. The microprocessor as defined in claim 35 wherein the adjustable delay elements further comprise an inverter having a plurality of transistors that may be selectively added to increase the inverter's propagation speed.

37. A microprocessor, comprising:

a cache region having a cache clock;

a jitter measurement circuit associated with the cache region, wherein the jitter measurement circuit measures an uncertainty window within which the cache clock makes state transitions;

wherein the jitter measurement circuit further comprises:

four delay units creating a four reference clock signals, each reference clock signal having the same frequency but differing in phase relationship;

a measurement unit coupled to the four reference clock signals and the cache clock, and wherein the measurement unit compares the cache clock to the plurality of reference clock signals to determine the uncertainty window of the cache clock; and a calibration unit coupled to the delay unit and configured to provide signals for calibration of the jitter measurement unit, wherein the calibration unit comprises:

thirty five inverter pairs coupled in series, and a first inverter pair in the series coupled to a clock signal, wherein a number of inverter pairs a propagating signals passes through in one period of the clock signal is indicative of speed of the inverter pairs in the calibration unit;

two inverter pairs coupled to the clock signal;

a first tap signal coupled to the inverters between a first inverter pair and a second inverter pair;

a second tap signal coupled to the two inverters after the second inverter pair; and wherein the phase difference between the first and second tap signals is proportional to a known portion of the clock period.

38. A microprocessor, comprising:

a cache region having a cache clock;

a jitter measurement circuit associated with the cache region, wherein the jitter measurement circuit measures an uncertainty window within which the cache clock makes state transitions;

wherein the jitter measurement circuit further comprises:
  four delay units creating a four reference clock signals, each reference clock signal having the same frequency but differing in phase relationship;
  a measurement unit coupled to the four reference clock signals, and the cache clock, and wherein the measurement unit compares the cache clock to the plurality of reference clock signals to determine the uncertainty window of the cache clock; and
  a calibration unit coupled to the delay unit and configured to provide signals for calibration of the jitter measurement unit;

wherein the measurement unit comprises:
  a phase detection circuit coupled to the four reference clock signals and the cache clock which compares the four reference clock signals and generates a thermometer code for each such comparison; and
  a min/max unit coupled to the phase detection unit and also to a scan chain, the min/max united adapted to record the minimum and maximum values produced by said phase detection circuit, and wherein the min/max unit further adapted to ship the minimum and maximum values off the microprocessor by way of the scan chain.

* * * * *